United States Patent
Arita et al.

(10) Patent No.: US 7,074,720 B2
(45) Date of Patent: Jul. 11, 2006

(54) PLASMA TREATING APPARATUS, PLASMA TREATING METHOD AND METHOD OF MANUFACTURING SEMICONDUCTOR DEVICE

(75) Inventors: Kiyoshi Arita, Fukuoka (JP); Tetsuhiro Iwai, Kasuga (JP); Hiroshi Haji, Chikushino (JP); Shoji Sakemi, Ogoori (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 490 days.

(21) Appl. No.: 10/178,444

(22) Filed: Jun. 21, 2002

(65) Prior Publication Data

US 2002/0197877 A1 Dec. 26, 2002

(30) Foreign Application Priority Data

Jun. 25, 2001 (JP) .......................... P. 2001-190973
Jul. 31, 2001 (JP) .......................... P. 2001-231469

(51) Int. Cl.
*H01L 21/302* (2006.01)
*H01L 21/3065* (2006.01)

(52) U.S. Cl. .................... 438/706; 438/710; 156/345
(58) Field of Classification Search ............... 438/706, 438/710; 156/345
See application file for complete search history.

(56) References Cited

U.S. PATENT DOCUMENTS

| | | | |
|---|---|---|---|
| 4,664,858 A | 5/1987 | Kido et al. | 264/44 |
| 5,693,182 A | 12/1997 | Mathuni | 438/727 |
| 6,086,710 A | 7/2000 | Miyashita et al. | 156/345 |
| 6,239,036 B1 | 5/2001 | Arita | 438/714 |
| 2002/0195202 A1* | 12/2002 | Arita et al. | 156/345.33 |

FOREIGN PATENT DOCUMENTS

| | | |
|---|---|---|
| JP | 61-278144 | 12/1986 |
| JP | 63-282179 | 11/1988 |
| JP | 6-2149 | 1/1994 |

* cited by examiner

*Primary Examiner*—Nadine G. Norton
*Assistant Examiner*—Lynette T. Umez-Eronini
(74) *Attorney, Agent, or Firm*—Pearne & Gordon LLP

(57) ABSTRACT

In a plasma treating apparatus, a ceramic porous substance having a three-dimensional network structure in which a frame portion 18a formed of ceramic containing alumina is provided continuously like a three-dimensional network is used for the material of an electrode member 17 for the plasma treating apparatus to be attached to the front surface of a gas supplying port of an electrode for plasma generation, and a gas for plasma generation is caused to pass through a hole portion 18b formed irregularly in the three-dimensional network structure. Consequently, the distribution of the gas to be supplied is made uniform to prevent an abnormal discharge so that uniform etching having no variation can be carried out.

11 Claims, 14 Drawing Sheets

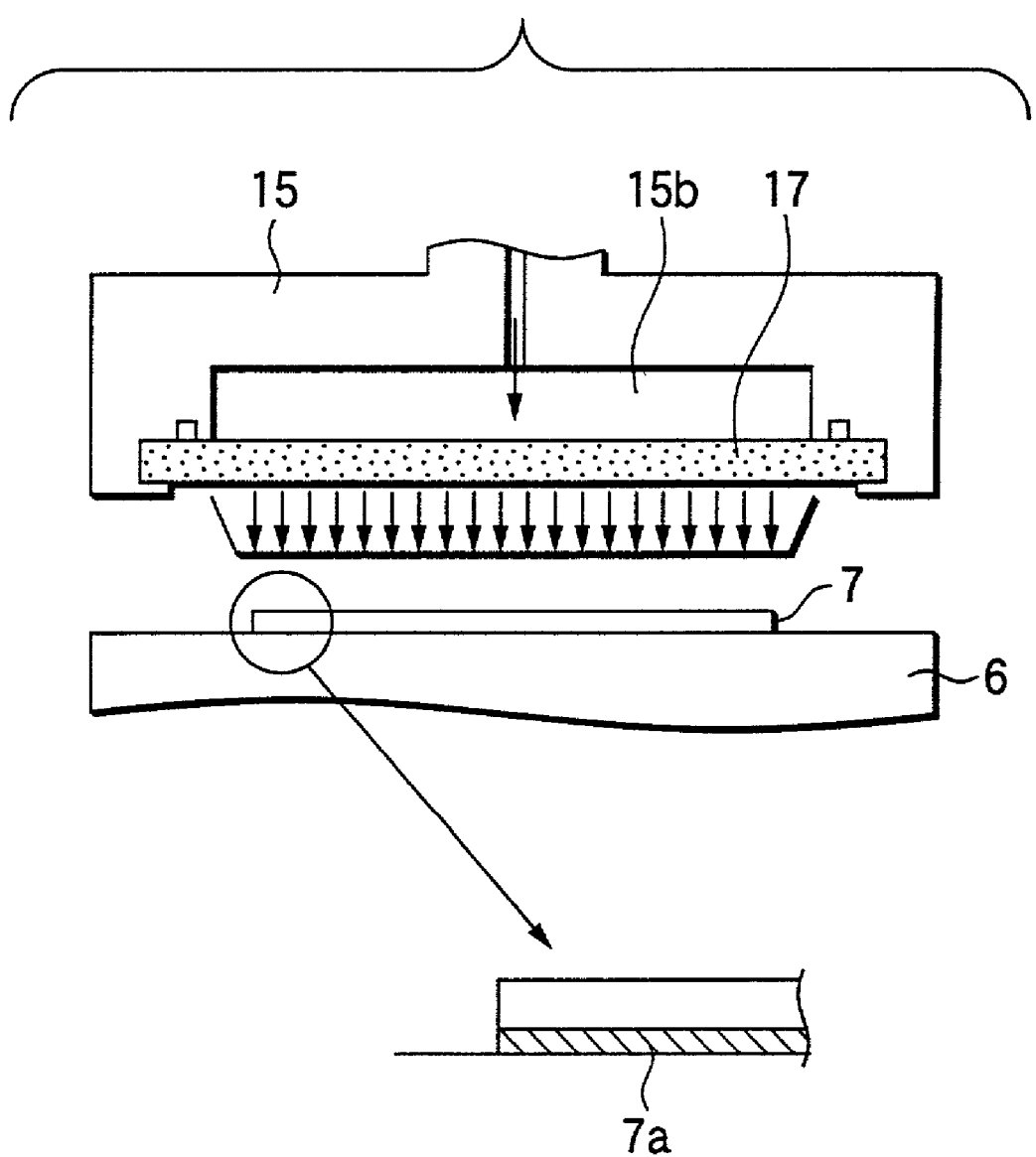

PLASMA TREATING APPARATUS, PLASMA TREATING METHOD AND METHOD OF MANUFACTURING SEMICONDUCTOR DEVICE

BACKGROUND OF THE INVENTION

The present invention relates to a plasma treating apparatus for etching a silicon based substrate such as a semiconductor wafer by a plasma.

In a process for manufacturing a semiconductor wafer to be used for a semiconductor device, a thinning process is performed for mechanically polishing the back face of a circuit formation surface and thinning the thickness of a substrate to reduce the thickness of the semiconductor device. As a result of the mechanical polishing or grinding process, a stress layer including a microcrack is generated on the surface of the semiconductor wafer. In order to prevent a reduction in the strength of the semiconductor wafer from being caused by the stress layer, an etching treatment for removing the stress layer is carried out after the mechanical polishing or griding. Plasma etching has been investigated in place of a conventional wet etching treatment that uses chemicals. Plasma etching eliminates the dangers associated with the use of chemicals as well as the generation of industrial wastes.

In the plasma etching treatment intended for silicon, it is necessary to generate a plasma having a high density in order to realize a higher etching rate. Therefore, a method of jetting and supplying a gas for plasma generation having a comparatively high pressure (which will be hereinafter referred to as a "gas") onto the surface of a semiconductor wafer is used. As such a method, conventionally, there has been known a method of using, as a gas supplying port, an upper electrode provided opposite to a lower electrode holding a semiconductor wafer and causing a discharge electrode plate to also serve as a gas introducing plate. In this case, the discharge electrode plate having a large number of fine gas supplying holes formed thereon is attached to the upper electrode, thereby uniformly supplying a gas to the surface of the semiconductor wafer.

In the case in which the discharge electrode plate is used, however, there are the following problems. In the method of jetting and supplying a gas from a gas supplying hole, the uniform distribution of the gas to be supplied is restricted and the amount of the gas to be jetted onto the surface of a semiconductor wafer is not uniform between a portion provided under the supplying hole and other portions.

For this reason, an abnormal discharge in which a plasma is convergently generated in the vicinity of the supplying hole is apt to be induced and various drawbacks are caused by the abnormal discharge. More specifically, etching is convergently performed in a portion in which the abnormal discharge is generated. Therefore, there is a drawback of decreased quality of etching, for example, a semiconductor wafer is damaged or an etching result has a variation. In addition, there is such a drawback that a discharge electrode plate provided with the gas supplying hole is worn by the plasma, depending on the material of the discharge electrode plate.

Moreover, the etched surface of a silicon based substrate does not become a clear mirror-like finished surface and a slightly opaque appearance portion is generated with a spot pattern.

SUMMARY OF THE INVENTION

According to the plasma treating apparatus and method in accordance with the invention, an electrode member having a three-dimensional network structure of which clearance constitutes a plurality of irregular paths for causing the gas for plasma generation to pass therethrough is used as the electrode member to be attached to the front surface of the gas supplying port for supplying a gas for plasma generation to a silicon substrate. Consequently, the gas to be supplied can be distributed uniformly to prevent an abnormal discharge, thereby carrying out uniform etching having no variation. Furthermore, the appearance of the silicon based substrate after the etching can have a mirror-like finished surface by using a mixed gas of a fluorine gas and helium as the gas for plasma generation.

According to the method of manufacturing a semiconductor device in accordance with the invention, in the manufacture of the semiconductor device having a circuit pattern created on the surface of a semiconductor element, the back face of a semiconductor wafer thinned by mechanical polishing or grinding is washed with a liquid and a polishing waste generated at the polishing step is removed, and the back face of the semiconductor wafer washed at the washing step is subjected to plasma etching so that a damage layer generated by the mechanical polishing or grinding is removed. Consequently, it is possible to reduce an environment load as compared with conventional wet etching using chemicals and to implement the method of manufacturing a semiconductor device at a low cost.

BRIEF DESCRIPTION OF THE DRAWINGS

FIG. 5 is a view showing the gas flow distribution of the plasma treating apparatus according to the first embodiment of the invention;

DETAILED DESCRIPTION OF THE INVENTION

FIRST EMBODIMENT

Next, an embodiment of the invention will be described with reference to the drawings.

Figure 1:
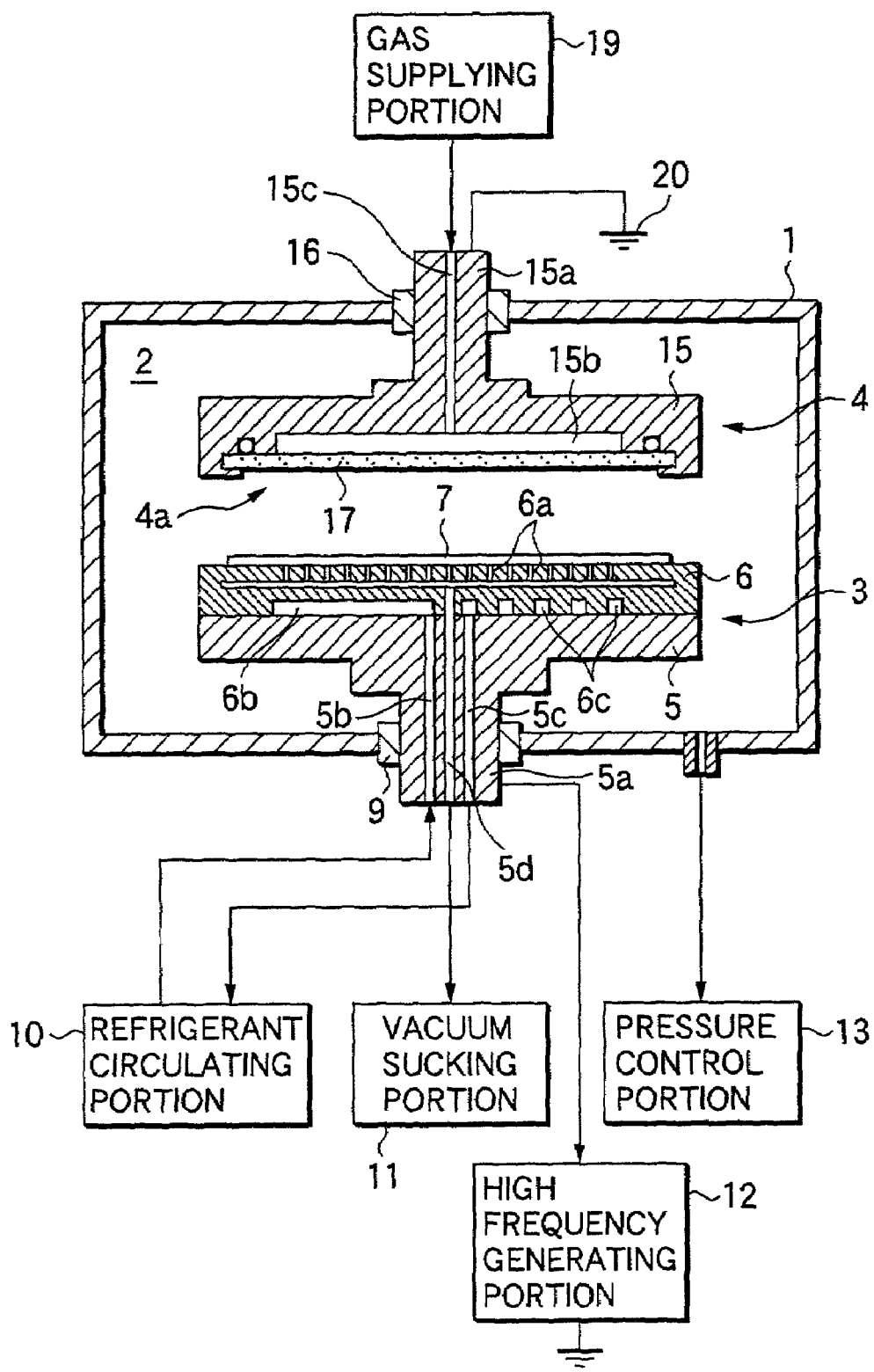
FIG. 1 is a sectional view showing a plasma treating apparatus according to a first embodiment of the invention.

First of all, the plasma treating apparatus will be described with reference to FIG. 1. In FIG. 1, inside of a vacuum chamber 1 is a treatment chamber 2 for carrying out a plasma treatment. A lower electrode 3 (a first electrode) and an upper electrode 4 (a second electrode) are vertically opposed to each other in the treatment chamber 2. The lower electrode 3 includes an electrode body 5 attached the vacuum chamber 1 through an insulator 9 made of polytetrafluorethylene by a support portion 5a extending downward. A holding portion 6 formed of a high thermal conductive material, e.g. aluminum, stainless steel or other suitable material, is attached to the upper surface of the electrode body 5, and a semiconductor wafer 7 (a silicon based substrate) provided with a circuit pattern is mounted on the upper surface of the holding portion 6. The vacuum chamber 1 and the electrode body 5 are formed of aluminum, stainless steel, or other suitable material. The holding portion 6 is formed such that a ceramic coating is subjected on a surface of aluminum, stainless steel, or other suitable material.

The semiconductor wafer 7 is set in a state obtained immediately after the back side of a circuit pattern formation surface is thinned by mechanical polishing or grinding, and a damage layer including a microcrack is formed on a polished surface. A protective tape 7a (see FIG. 5) is stuck to the circuit pattern formation surface of the silicon wafer 7 and is placed in contact with the holding portion 6. The polished surface (the back side of the circuit formation surface) to be a treated surface is turned upward. The damaged layer of the polished surface is removed (etched) by the plasma treatment.

A large number of suction holes 6a opened to an upper surface are provided in the holding portion 6, and communicate with a sucking path 5d extending through the support portion 5a of the electrode body 5. The sucking path 5d is connected to a vacuum sucking portion 11 and vacuum suction is carried out through the vacuum sucking portion 11 with the semiconductor wafer 7 mounted on the upper surface of the holding portion 6 so that the semiconductor wafer 7 is held in the holding portion 6 by vacuum adsorption.

Refrigerant passages 6b and 6c for cooling are provided in the holding portion 6 and communicate with ducts 5b and 5c extending through the support portion 5a. The ducts 5b and 5c are connected to a refrigerant circulating portion 10. By driving the refrigerant circulating portion 10, a refrigerant such as cooling water is circulated in the refrigerant passages 6b and 6c. Consequently, the holding portion 6 heated by heat generated during the plasma treatment is cooled.

The electrode body 5 is electrically connected to a high frequency generating portion 12 and the high frequency generating portion 12 applies a high frequency voltage between the lower electrode 3 and the upper electrode 4. Moreover, the treatment chamber 2 in the vacuum chamber 1 is connected to a pressure control portion 13. The pressure control portion 13 carries out a pressure reduction in the treatment chamber 2 and atmospheric opening at a vacuum breakdown in the treatment chamber 2.

The upper electrode 4 is provided in an opposite position to the lower electrode 3 and includes an electrode body 15, which is made of aluminum, stainless steel, or other suitable material, grounded to a grounding portion 20. The electrode body 15 is attached to the vacuum chamber 1 through an insulator 16 made of polytetrafluorethylene by a support 15a extended upward. The electrode body 15 is an electrode for plasma generation for supplying a gas for plasma generation to the treatment chamber 2, and has a lower surface provided with a gas supplying port 15b communicating with a gas supplying path 15c extending through the support portion 15a. The gas supplying path 15c is connected to a gas supplying portion 19 that supplies, as the gas for plasma generation, a gas mixture containing a fluorine-based gas such as carbon tetrafluoride ($CF_4$) or sulfur hexafluoride ($SF_6$) and a carrier gas (for example, a helium gas (He)).

Figure 2A:
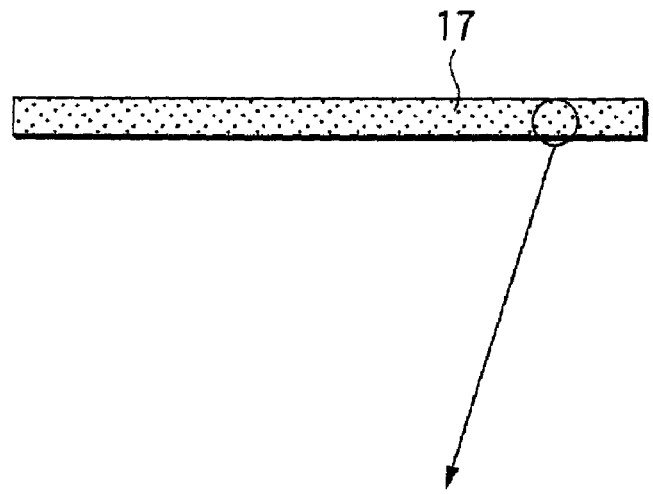
FIG. 2A is a sectional view showing an electrode member according to the first embodiment of the invention.
Figure 2B:
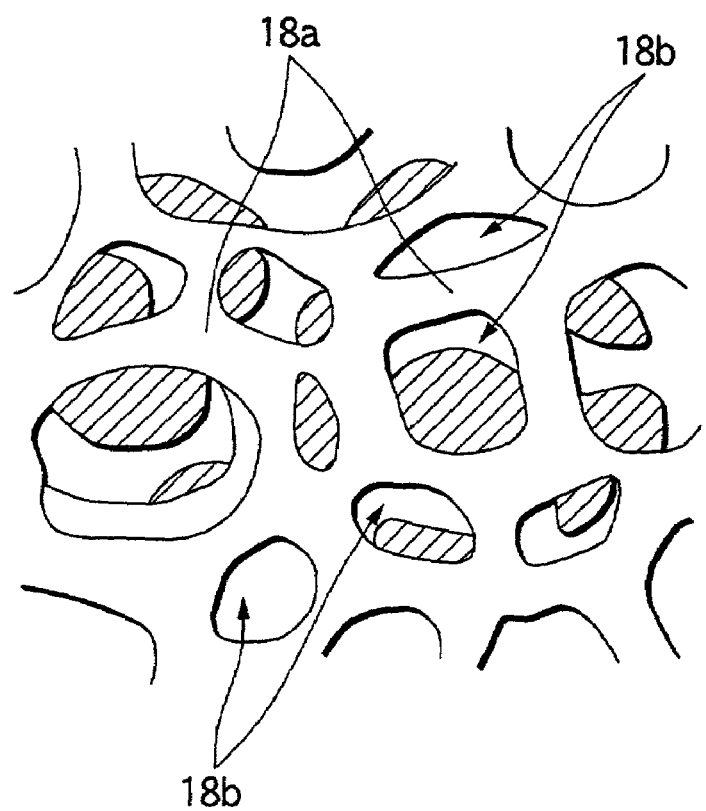
FIG. 2B is an enlarged sectional view of FIG. 2A.

An electrode member 17 is attached to the front surface of the gas supplying port 15b. The electrode member 17 is a disc-shaped member comprising a ceramic porous substance. As shown in FIG. 2, the ceramic porous substance has a three-dimensional network structure in which a frame portion 18a of ceramic is formed continuously as a three-dimensional network and has a large number of hole portions 18b (clearances) therein. An average size of the hole portions 18b is about 100 μm to 300 μm in its diameter. The hole portion 18b having the three-dimensional network structure constitutes a plurality of irregular paths to allow a gas to pass through the electrode member 17 from the gas supplying port 15b. The electrode member 17 has a thickness greater than 5 mm.

Figure 3:
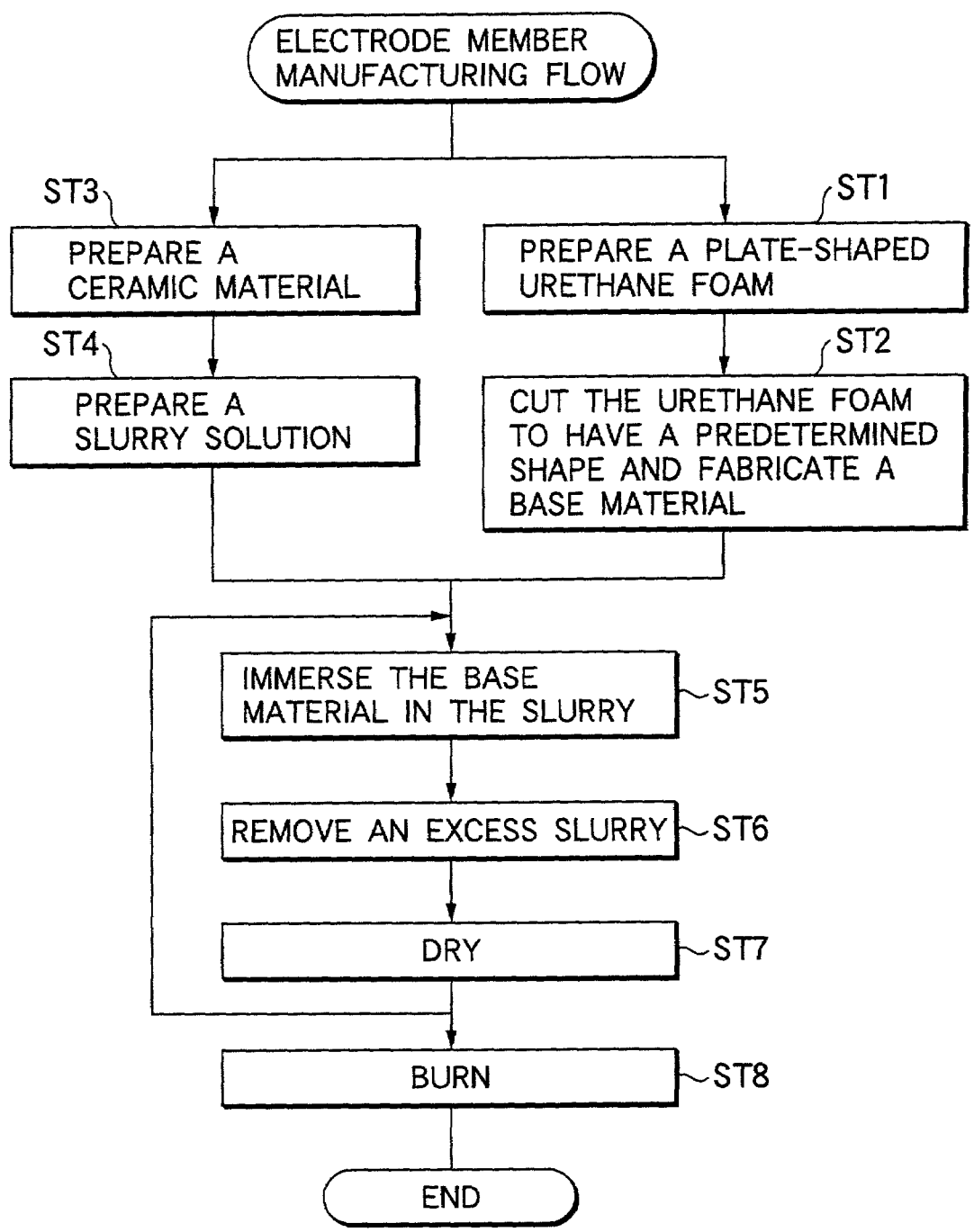
FIG. 3 is a flow chart for manufacturing the electrode member according to the first embodiment of the invention.
Figure 4A:
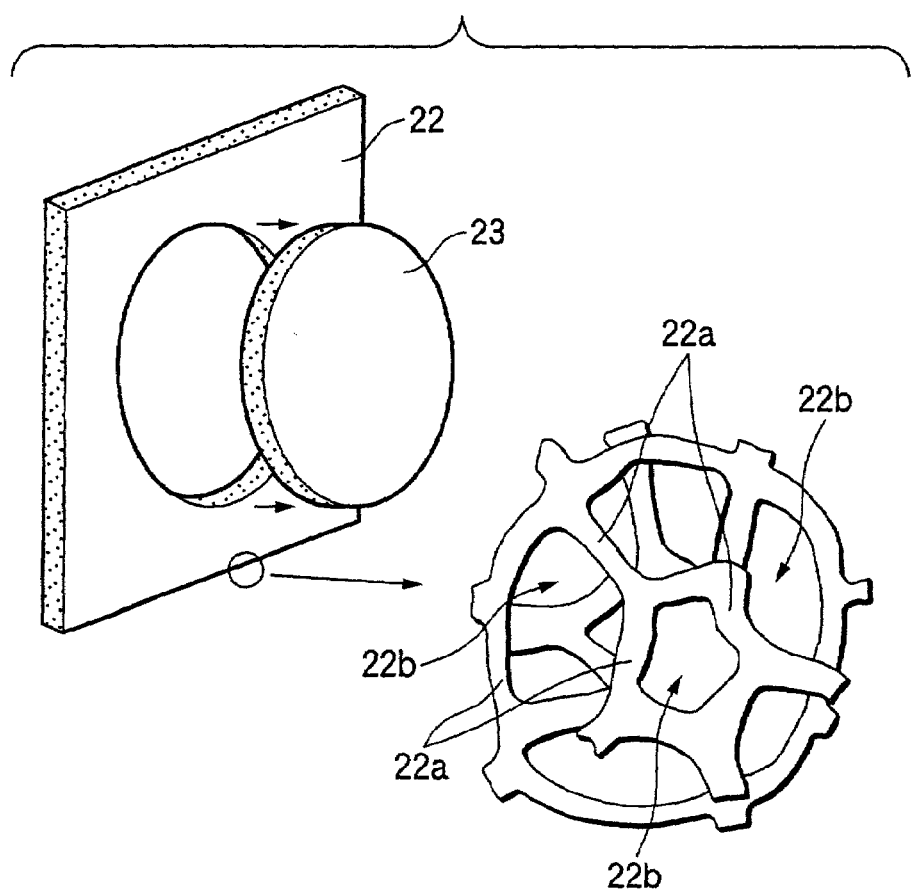
FIG. 4 is a view illustrating a method of manufacturing the electrode member according to the first embodiment of the invention.

A method of manufacturing the electrode member 17 will be described with reference to FIGS. 3 and 4. The electrode member 17 is manufactured by sticking ceramic to a polyurethane foam to be a base material. First of all, a plate-shaped urethane foam 22 is prepared (ST1), and is cut to take a predetermined shape of a disc to fabricate a base material 23 as shown in FIG. 4A (ST2). The urethane foam 22 has such a structure that a core 22a is continuously provided like the three-dimensional network and a void portion 22b is formed therein at a high porosity.

At the same time, alumina powder to be a ceramic material is prepared (ST3) and water and a surfactant for applying a fluidity to the alumina powder are added thereto, thereby forming a slurry solution 24 (ST4).

Figure 4B:
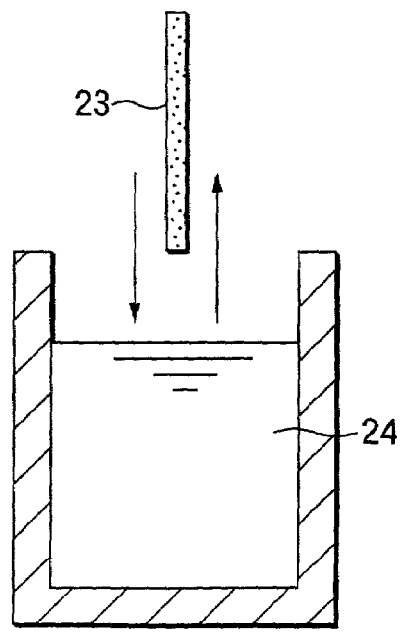

As shown in FIG. 4B, then, the base material 23 is immersed in the slurry 24 (ST5) and an excess slurry is removed from the base material 23 after pull-up (ST6). Thereafter, the base material 23 is dried to remove the water content (ST7). Subsequently, heating is carried out to cure the ceramic so that an electrode member comprising the ceramic porous substance having the three-dimensional network structure is finished (ST8) The base material 23 disappears as burnt urethane in the burning step. Therefore, an electrode member containing only the ceramic material is obtained. The steps (ST5) to (ST7) are repeatedly carried out plural times if necessary.

The electrode member 17 thus manufactured has the following characteristics. First of all, the frame portion 18a forming the hole portion 18b is molded by sticking ceramic to the periphery of the core 22a of the urethane foam 22. Therefore, it is possible to obtain a porous substance having a uniform pore size and distribution of the hole portion 18b. A mean pore size is preferably 800 μm or less in order to prevent the concentration of a plasma (an abnormal discharge). More preferably, an average of the pore size is set as 100 μm to 300 μm.

In the electrode member 17 comprising the ceramic porous substance according to the embodiment, a porosity is mainly determined by the array density of the core in the urethane foam to be used as a base material. Accordingly, it is possible to stick ceramic having fine crystal grains to the periphery of the core and to sinter the ceramic at a high temperature, thereby forming the frame portion 18a constituted by a fine ceramic sintered substance having a high strength, a heat resistance and a heat shock resistance. Grain size of ceramic powder used in the invention is about 0.5 μm to 2.0 μm.

The electrode member 17 comprising a ceramic porous substance thus manufactured is formed by continuously providing, like the three-dimensional network, the frame portion 18a having such a structure that the fine crystal of alumina is bonded at a high density. Therefore, a heat resistance and a heat shock resistance are excellent. More specifically, even if the electrode member 17 is used in a severe place to be directly exposed to a plasma in the plasma treating apparatus, a crack or a breakdown is not generated by a thermal shock because the frame portion 18a having the mutual crystal grains bonded strongly is continuously formed with a three-dimensionally isotropic structure. Accordingly, a sufficient durability can be obtained also in a place to be directly exposed to the plasma.

In general, moreover, ceramic having a high strength is hard to process and is molded into a component having an optional shape with difficulty. However, the electrode member 17 can be molded to have a desirable shape very easily by previously cutting the urethane foam 22 into a predetermined shape.

The plasma treating apparatus is constituted as described above, and the plasma treatment (etching) to be carried out for the semiconductor wafer 7 will be described below with reference to FIG. 5. First of all, the semiconductor wafer 7 is mounted on the holding portion 6 with the protective tape 7a turned downward. A pressure reduction is carried out in the treatment chamber 2 by the pressure control portion 13 (FIG. 1), and the gas supplying portion 19 is then driven. Thus, a gas is injected downward from the electrode member 17 attached to the upper electrode 4.

Description will be given to a gas flow distribution at this time. The gas supplied from the gas supplying portion 19 can be prevented from freely flowing in the gas supplying port 15b by means of the electrode member 17. Consequently, the gas temporarily stays in the gas supplying port 15b so that the distribution of the pressure of the gas becomes almost uniform therein.

By the pressure, the gas reaches the lower surface of the electrode member 17 from the gas supplying port 15b through the hole portions 18b (FIG. 2) of the ceramic porous substance constituting the electrode member 17 and is sprayed toward the surface of the semiconductor wafer 7 which is provided thereunder. At this time, a large number of hole portions 18b are formed in an irregular arrangement in the electrode member 17. Therefore, the distribution of the flow of the gas to be sprayed downward from the lower surface of the electrode member 17 becomes uniform without a deviation over almost the whole range of the gas supplying port 15b.

In this state, the high frequency generating portion 12 is driven to apply a high frequency voltage to the electrode body 5 of the lower electrode 3. Consequently, a plasma discharge is generated in a space formed between the upper electrode 4 and the lower electrode 3. A plasma etching treatment is carried out over the upper surface of the semiconductor wafer 7 mounted on the holding portion 6 through the plasma generated by the plasma discharge. In this embodiment, when a damaged layer including a microcrack is etched, an etching rate of 2 μm/min can be obtained. According to the present invention, an etching rate higher than 1 μm/min is obtained.

In the plasma etching, fluorine radial SF* (active species) in a plasma reacts to silicon Si so that a compound (SFn) of fluorine and sulfur tries to adhere to the upper surface (etched surface) of the semiconductor wafer 7 etched as are action product. However, the reaction product is removed from the etched surface by the carrier gas.

When the reaction product adheres to the etched surface, a concave-convex portion is formed on the etched surface during the plasma etching so that the appearance of the etched surface becomes slightly opaque. By mixing the carrier gas, however, the etched surface can be prevented from becoming slightly opaque and can become a mirror-like finished surface. Helium (He) is the most suitable for the carrier gas and has the function of stabilizing a discharge to prevent an abnormal discharge.

In the plasma etching treatment, the distribution of the flow of the gas to be sprayed onto the surface of the semiconductor wafer 7 is made uniform over the whole range by means of the electrode member 17 having a rectifying function. The rectifying function means that the gas supplied and passed in the irregular paths are made uniform its injection pressure entire surface of the electrode member, while the injection directions in the irregular paths are influenced to be an even gas flow entire surface of the electrode member. Therefore, it is possible to prevent an abnormal discharge from being generated due to the concentration of the plasma discharge over such a range that the gas partially has a high density.

Moreover, the electrode member 17 according to the embodiment includes the frame portion having mutual crystal grains bonded strongly which is continuously provided with the three-dimensionally isotropic structure (the three-dimensional network structure). Even if the electrode member 17 is used in a severe place to be directly exposed to a plasma, a crack or a breakdown is not generated by a thermal shock. Accordingly, if a rectifying plate for making the distribution of the gas flow uniform is to be provided in the gas supplying port, it is conventionally necessary to provide the rectifying plate separately from the discharge electrode plate to be exposed to the plasma. In the embodiment, however, the same electrode member 17 can have the functions of the discharge electrode plate and the rectifying plate.

In the embodiment of the invention, as described above, it is possible to carry out various changes. For example, while the alumina has been taken as an example of the material of the electrode member 17, it is also possible to use alumina-based ceramics and aluminum-based ceramics in addition to the alumina. In this case, it is important to select a material which is hard to react with a gas for plasma to be used, that is, ceramics having high corrosion resistance. Further, borosilicate glass, which is an alkaline rare earth metal, also can be used as a material of the electrode member. For a fluorine gas to be used in the embodiment, it is preferable to use metal fluoride having a high boiling point and a low vapor pressure in vacuum which is represented by oxide, nitride and carbide containing alkaline earth metal in addition to the alumina based gas.

Furthermore, while there has been described the example in which an urethane foam structure is utilized for the three-dimensional network structure, the three-dimensional network structure (the three-dimensional network structure) of a fabric, a linear fiber or metal may be used in place of the urethane foam.

For the method of manufacturing the electrode member 17 having the three-dimensional network structure, moreover, it is also possible to use a method of mixing and sintering fine particles of ceramic and beads-shaped resin particles. In this case, the resin particles are burnt by heat during the sintering, and a space formed by the burning becomes an irregular path and a residual structure becomes the frame portion constituting the three-dimensional network structure.

While the example in which the semiconductor wafer for the semiconductor device to be a silicon based substrate is intended for the plasma treatment has been described in the embodiment, the invention is not restricted to the semiconductor wafer. For example, a quartz plate to be used for a quartz oscillator which is intended for a material containing silicon can also be applied to the invention.

Next, an example in which the plasma treating apparatus according to the invention is applied to a semiconductor manufacturing apparatus will be described in second and third embodiments.

SECOND EMBODIMENT

Figure 6:
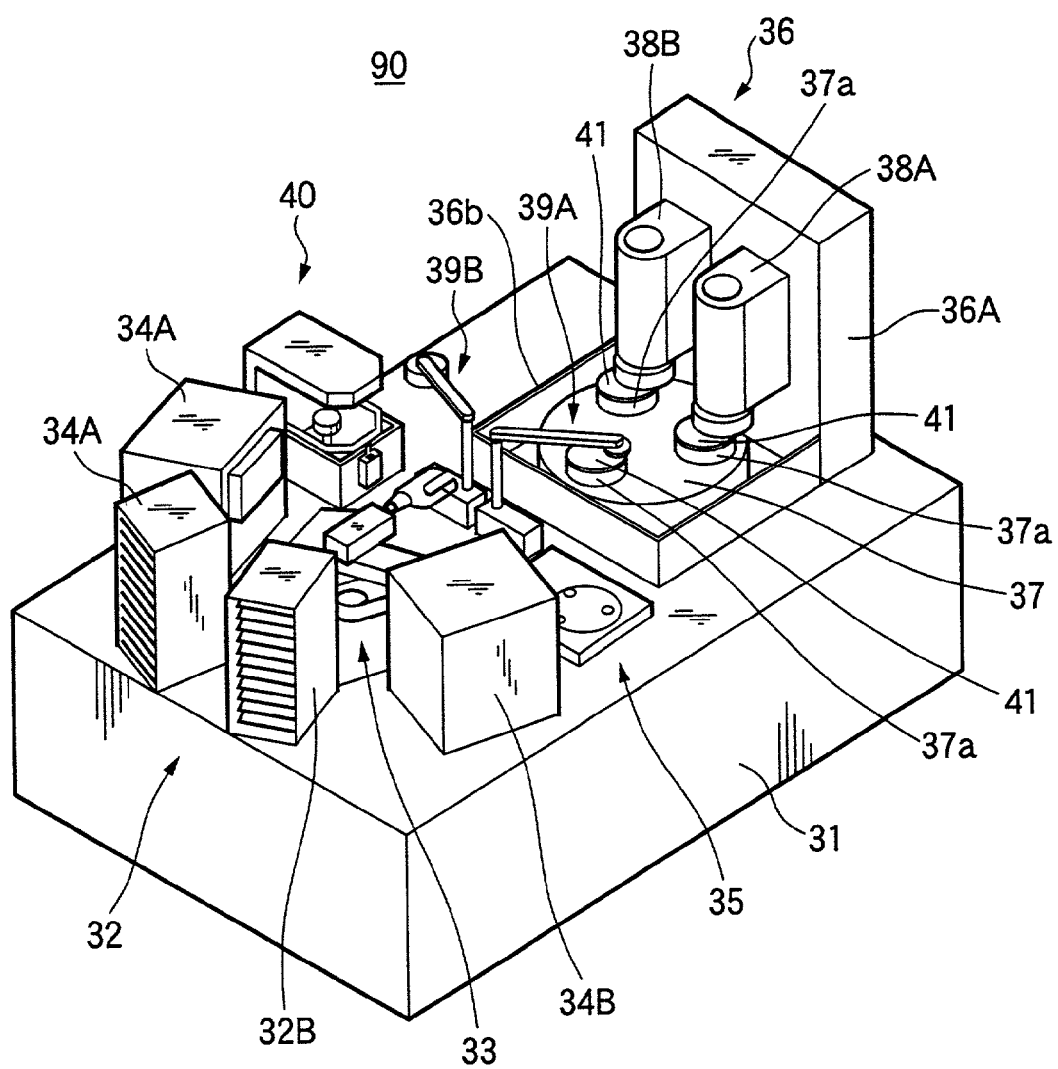
FIG. 6 is a perspective view showing a semiconductor wafer processing apparatus according to a second embodiment of the invention.

Referring to FIG. 6, first of all, a semiconductor wafer processing apparatus 90 will be described. In FIG. 6, a wafer housing portion 32, a first plasma treating portion 34A, a second plasma treating portion 34B, a pre-center portion 35 and a washing portion 40 are radially provided on the upper surface of a base portion 31 around a wafer delivery portion 33 including a robot arm, and a polishing portion 36 is provided adjacently to the pre-center portion 35.

The wafer housing portion 32 includes two magazines 32A and 32B for wafer accommodation and accommodates a semiconductor wafer before and after a processing. The first plasma treating portion 34A and the second plasma treating portion 34B carry out dry etching over the surface of a semiconductor wafer by the etching function of a plasma generated under a pressure reducing atmosphere. The pre-center portion 35 carries out a pre-center operation for aligning the semiconductor wafer to be transferred to the polishing portion 36. The washing portion 40 washes the semiconductor wafer polished by the polishing portion 36 with a washing solution.

The polishing portion 36 includes a wall portion 36*a* erected on the upper surface of the base portion 31, and a first polishing unit 38A and a second polishing unit 38B are provided on the front side surface of the wall portion 36*a*. The first polishing unit 38A and the second polishing unit 38B respectively perform rough polishing and finishing polishing over a semiconductor wafer 41. A turntable 37 is surrounded by a platform 36*b* under the first polishing unit 38A and the second polishing unit 38B. The turntable 37 has wafer holding portions 37*a*, and is index rotated with the semiconductor wafer 41 held in one of the wafer holding portions 37*a*, thereby positioning the semiconductor wafer 41 to be polished with respect to the first polishing unit 38A and the second polishing unit 38B.

A wafer delivery-in portion 39A and a wafer delivery-out portion 39B, which include respective delivery arms, are provided on the side of the polishing portion 36 opposite the wall portion 36*a*. The wafer delivery-in portion 39A delivers, into the polishing portion 36, the semiconductor wafer aligned by the pre-center portion 35. The wafer delivery-out portion 39B delivers the mechanically polished semiconductor wafer from the polishing portion 36. Accordingly, the wafer delivery portion 33, the wafer delivery-in portion 39A and the wafer delivery-out portion 39B are wafer handling means for transferring the semiconductor wafer 41 to and from the polishing portion 36, the washing portion 40, the first plasma treating portion 34A or the second plasma treating portion 34B, supplying the semiconductor wafer 41 to the polishing portion 36 and taking the semiconductor wafer 41 subjected to the dry etching from the first plasma treating portion 34A or the second plasma treating portion 34B.

Figure 7:
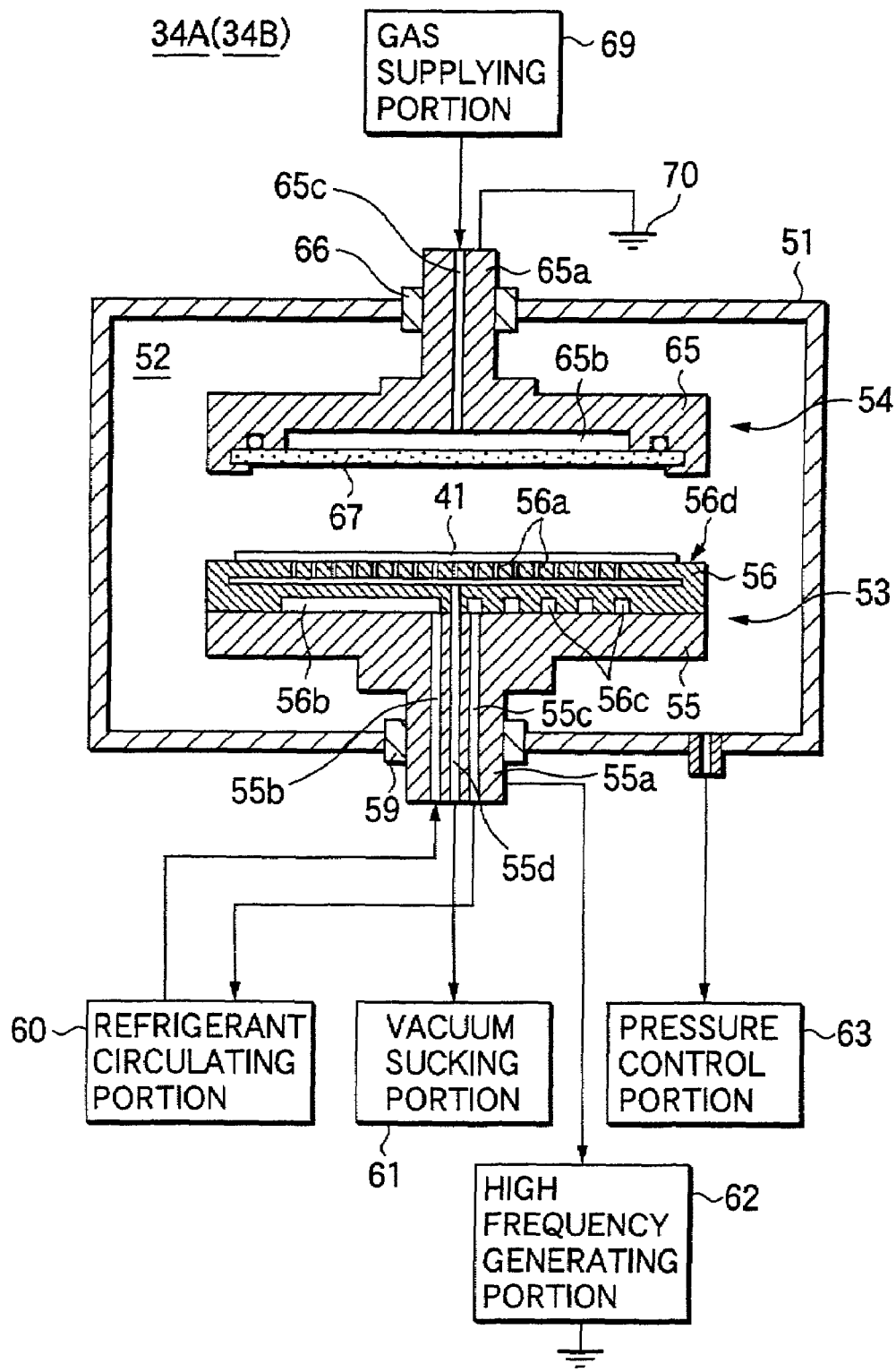
FIG. 7 is a sectional view showing the plasma treating portion of the semiconductor wafer processing apparatus according to the second embodiment of the invention.
Figure 8A:
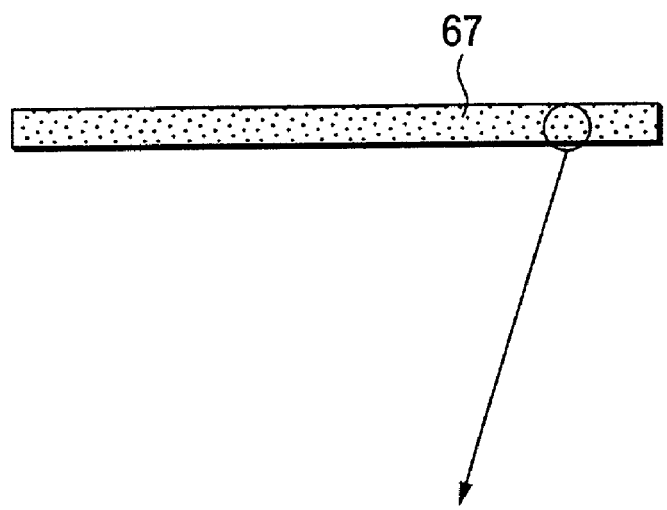
FIG. 8 is a sectional view showing the electrode member of the plasma treating portion in the semiconductor wafer processing apparatus according to the second embodiment of the invention.
Figure 8B:
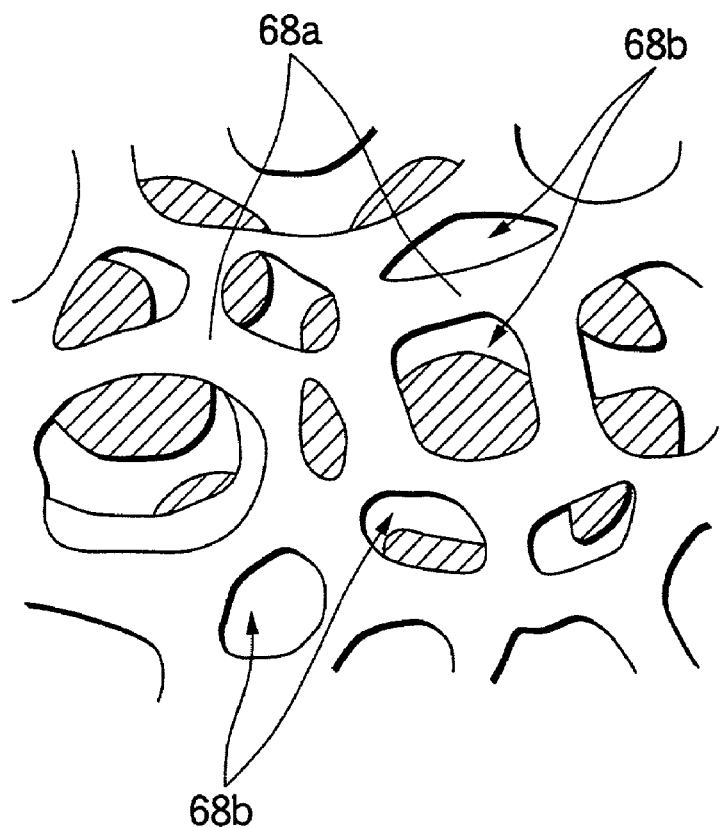

With reference to FIGS. 7 and 8, next, the plasma treating portions 34A and 34B will be described. The plasma treating portions 34A and 34B have the same structure as that of the plasma treating apparatus according to the first embodiment. In FIG. 7, the inside of a vacuum chamber 51 serves as a treatment chamber 52 for carrying out a plasma treatment and a lower electrode 53 (a first electrode) and an upper electrode 54 (a second electrode) are vertically provided in the treatment chamber 52. The lower electrode 53 includes an electrode body 55 attached to the vacuum chamber 51 through an insulator 59 made of polytetrafluoroethylene by means of a support portion 55*a* extending downward. A holding portion 56 formed of a high thermal conductive material, e.g. aluminum, stainless steel, or other suitable material, is attached to the upper surface of the electrode body 55, and the semiconductor wafer 41 provided with a circuit pattern is mounted on the holding surface 56*d* of the upper surface of the holding portion 56. The vacuum chamber 51 and the electrode body 55 are formed of aluminum, stainless steel, or other suitable material. The holding portion 56 is formed such that a ceramic coating is subjected on a surface of aluminum, stainless steel, or other suitable material.

The semiconductor wafer 41 is set in a state obtained immediately after the back side of a circuit pattern formation surface is thinned by mechanical polishing or grinding, and a damage layer including a microcrack is formed on a polished surface. A protective tape 43 is stuck to the surface of the semiconductor wafer 41 on which the circuit pattern 42 is to be formed and is hermetically attached to the holding surface 56*d*. Thus, the polished surface (the back side of the circuit formation surface) to be treated is turned upward. The damaged layer of the polished surface is removed (etched) by the plasma treatment.

A large number of suction holes 56*a* opened to an upper surface are provided in the holding portion 56, and communicate with a sucking path 55*d* extending through the support portion 55*a* of the electrode body 55. The sucking path 55*d* is connected to a vacuum sucking portion 61 and vacuum suction is carried out through the vacuum sucking portion 61 with the semiconductor wafer 41 mounted on the holding surface 56*d* of the upper surface of the holding portion 56 so that the semiconductor wafer 41 is held in the holding portion 56 by vacuum adsorption.

Refrigerant passages 56*b* and 56*c* for cooling are provided in the holding portion 56 and communicate with ducts 55*b* and 55*c* extending through the support portion 55*a*. The ducts 55b and 55c are connected to a refrigerant circulating portion 60. By driving the refrigerant circulating portion 60, a refrigerant such as cooling water is circulated in the refrigerant passages 56b and 56c. Consequently, the holding portion 56 heated by heat generated during the plasma treatment is cooled, thereby preventing the thermal damage of the protective tape 43 attached hermetically to the holding surface 56d.

The electrode body 55 is electrically connected to a high frequency generating portion 62 and the high frequency generating portion 62 applies a high frequency voltage between the lower electrode 53 and the upper electrode 54. Moreover, the treatment chamber 52 in the vacuum chamber 51 is connected to a pressure control portion 63. The pressure control portion 63 carries out a pressure reduction in the treatment chamber 52 and atmospheric opening at a vacuum breakdown in the treatment chamber 52.

The upper electrode 54 is provided in an opposite position to the lower electrode 53 and includes an electrode body 65, which is made of aluminum, stainless steel, or other suitable material, and an electrode member 67 having an opposed surface that is parallel with the holding surface 56d. The electrode body 65 is attached to the vacuum chamber 51 through an insulator 66 made of polytetrafluorethylene by a support portion 65a extending upward and is grounded to a grounding portion 70. Moreover, the electrode body 65 is an electrode for plasma generation and for supplying a gas for plasma generation to the treatment chamber 52, and has an opposed surface to the holding surface 56d provided with a gas supplying port 65b communicating with a gas supplying path 65c extending through the support portion 65a. The gas supplying path 65c is connected to a gas supplying portion 69 and the gas supplying portion 69 supplies, as the gas for plasma generation, a gas mixture containing a fluorine based gas such as carbon tetrafluoride ($CF_4$) or sulfur hexafluoride ($SF_6$) and a rare gas such as helium (He).

An electrode member 67 is attached to the front surface of the gas supplying port 65b. The electrode member 67 is a disc-shaped member comprising a ceramic porous substance. As shown in FIG. 8, the ceramic porous substance has a three-dimensional network structure in which a frame portion 68a of ceramic is formed continuously as a three-dimensional network and has a large number of void portions 68b (clearances) therein. An average size of the void portions 68b is about 100 µm to 300 µm in its diameter. The void portion 68b having the three-dimensional network structure constitutes a plurality of irregular paths for causing a gas to pass through the electrode member 67 from the gas supplying port 65b. The electrode member 67 has a thickness greater than 5 mm.

Figure 9:
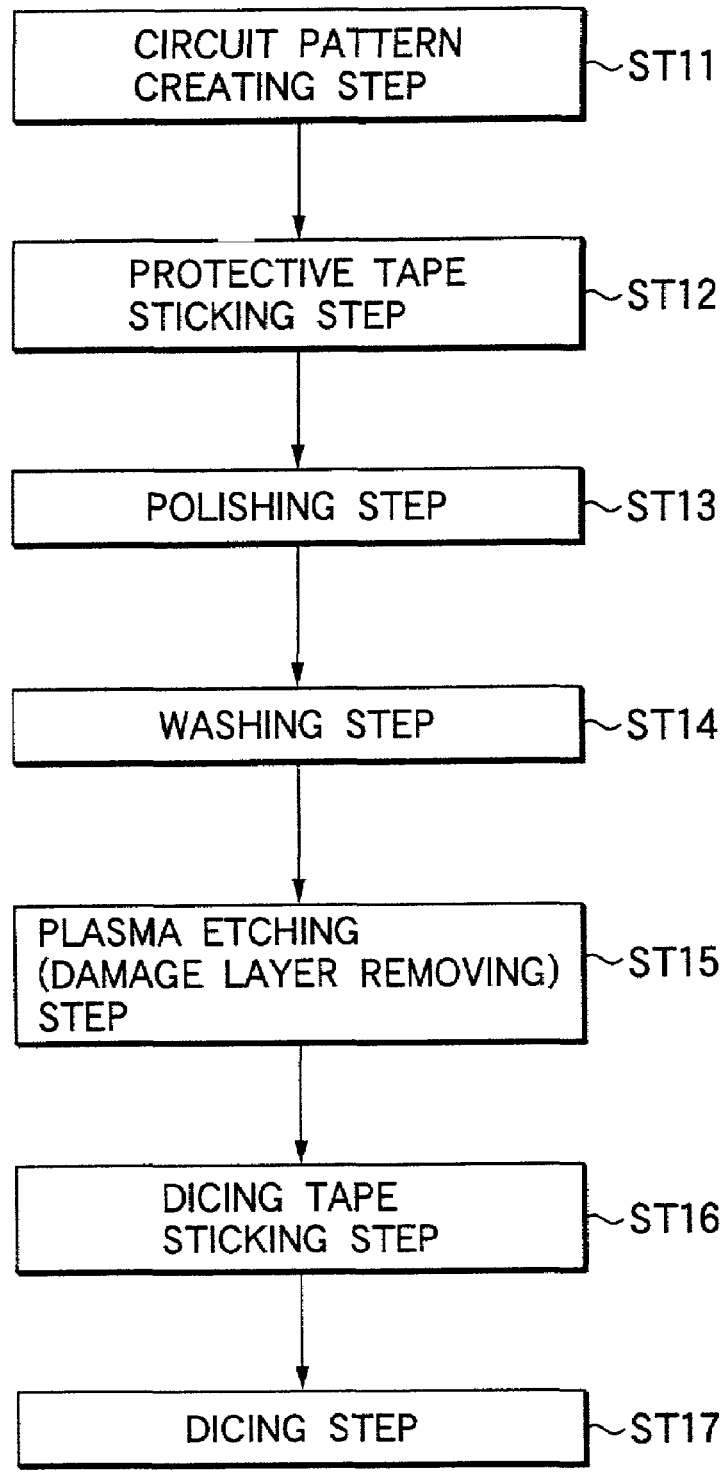
FIG. 9 is a flow chart showing a method of manufacturing a semiconductor device according to the second embodiment of the invention.

With reference to FIGS. 9 to 11, next, description will be given to a method of manufacturing a semiconductor device having a circuit pattern created on the surface of a semiconductor element. In FIGS. 10A and 10B, the reference numeral 41 denotes a semiconductor wafer, and a circuit pattern 42 of a plurality of semiconductor elements is created on the upper surface of the semiconductor wafer 41 (a circuit pattern creating step) (ST11). As shown in FIG. 10C, next, a protective tape 43 is stuck to the surface of the semiconductor wafer 41 having the circuit pattern 42 created thereon (a protective tape sticking step) (ST12).

Figure 10A:
FIG. 10 is a view illustrating a process for the method of manufacturing a semiconductor device according to the second embodiment of the invention.
Figure 10B:
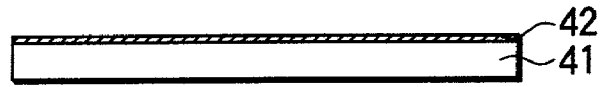
Figure 10C:
Figure 10D:
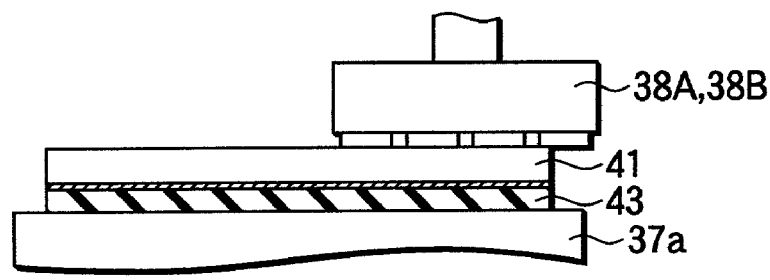
Figure 10E:
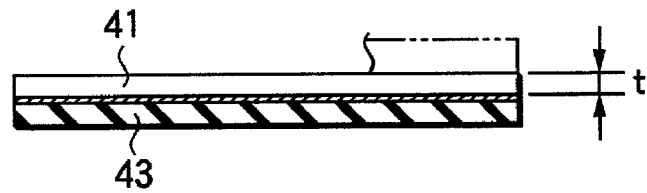

The semiconductor wafer 41 in this state is accommodated in a magazine 32A, 32B and is thus sent to the semiconductor wafer processing apparatus 90 shown in FIG. 6. The magazines 32A, 32B are attached to the wafer housing portion 32. The back face of the semiconductor wafer 41 taken out of the wafer housing portion 32 by means of the robot arm of the wafer delivery portion 33 is mechanically polished and thinned by means of the polishing portion 36 (a polishing step) (ST13). More specifically, the semiconductor wafer 41 thus taken out is aligned in the pre-center portion 35 and is then mounted on the wafer holding portion 37a of the turntable 37 by the wafer delivery-in portion 39A with a back face thereof turned upward, and the back face is mechanically polished by the first polishing unit 38A and the second polishing unit 38B as shown in FIG. 10D. Consequently, as shown in FIG. 10E, the semiconductor wafer 41 is thinned to have a predetermined thickness t.

Figure 10F:
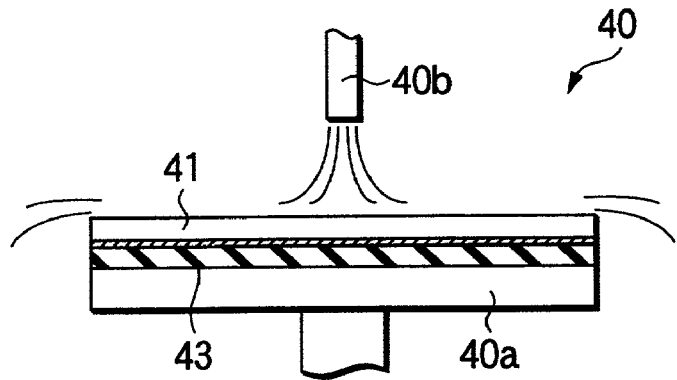

Subsequently, the semiconductor wafer 41 is delivered from the polishing portion 36 to the washing portion 40 by means of the wafer delivery-out portion 39B. Herein, the back face of the semiconductor wafer 41 polished mechanically is washed with a liquid to remove a polishing dust generated at the polishing step (a washing step) (ST14). More specifically, as shown in FIG. 10F, the semiconductor wafer 41 has the protective tape 43 held in the wafer holding portion 40a of the washing portion 40 and a washing solution is jetted onto the back face of the semiconductor wafer 41 (the mechanical polished surface) by means of a washing nozzle 40b in this state. After the washing solution is jetted, the surface of the semiconductor wafer 41 is drained off and dried.

Next, the washed semiconductor wafer 41 is sent to one of the first plasma treating portion 34A and the second plasma treating portion 34B by means of the wafer delivery portion 33. The washed back face of the semiconductor wafer 41 is subjected to plasma etching, thereby removing a damage layer generated by the mechanical polishing or grinding (a damage layer removing step) (ST15). More specifically, the protective tape 43 of the semiconductor wafer 41 is hermetically stuck to the holding surface 56d to hold the semiconductor wafer 41 in the lower electrode 53 in such an attitude that the mechanically polished surface is turned upward. The mechanically polished surface is subjected to plasma etching by a plasma generated by supplying a gas from the electrode member 67 on the opposed surface in the upper electrode 54 which is provided in parallel with the holding surface 56d and applying a high frequency voltage between the lower electrode 53 and the upper electrode 54 by means of the high frequency generating portion 62.

The gas for plasma generation in the plasma etching is supplied through the electrode member 67 having the three-dimensional network structure and the gas for plasma generation is uniformly blown off from an irregular path formed by the clearance of the three-dimensional network structure to the semiconductor wafer 41. Consequently, it is possible to carry out a uniform plasma treatment having no variation.

Prior to the plasma etching, furthermore, the surface of the semiconductor wafer 41 is washed to remove foreign substances such as polishing dust. Therefore, it is possible to obtain the etched surface having excellent quality of appearance without causing such a drawback that the surface of the semiconductor wafer 41 presents a slightly opaque appearance after the plasma etching. Moreover, the holding portion 56 of the lower electrode 53 is cooled by a refrigerant. Therefore, the protective tape 43 can be prevented from being damaged by heat generated by the plasma.

Figure 11A:
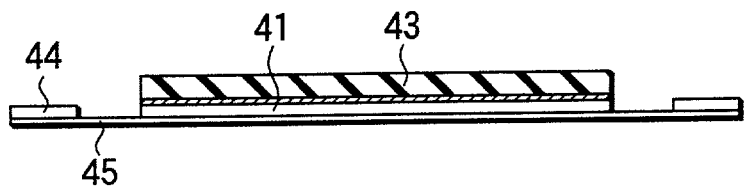
FIG. 11 is a view illustrating the process for the method of manufacturing a semiconductor device according to the second embodiment of the invention.
Figure 11B:
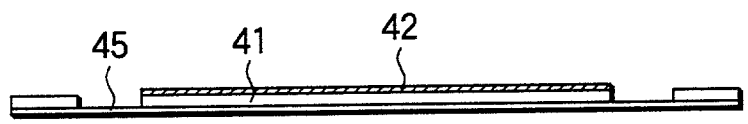

After the plasma etching is thus carried out, the semiconductor wafer 41 is accommodated back in one of the magazines 32A and 32B by the wafer delivery portion 33 and is taken out of the semiconductor wafer processing apparatus 90. The protective tape 43 is peeled from the semiconductor wafer 41 thus taken out and a dicing tape is stuck to the back face of the semiconductor wafer 41 (a dicing tape sticking step) (ST16). More specifically, as shown in FIG. 11A, the semiconductor wafer 41 which is thinned and has the protective tape 43 stuck thereto is stuck to a dicing tape 45 (an adhesive tape) set to a wafer ring 44 in such an attitude that the protective tape 43 is turned upward. The protective tape 43 is peeled so that the circuit pattern 42 is exposed to an upper surface as shown in FIG. 11B.

Figure 11C:
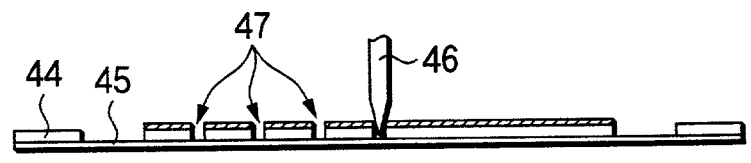
Figure 11D:
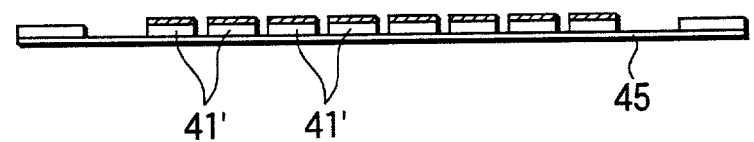
Figure 12:
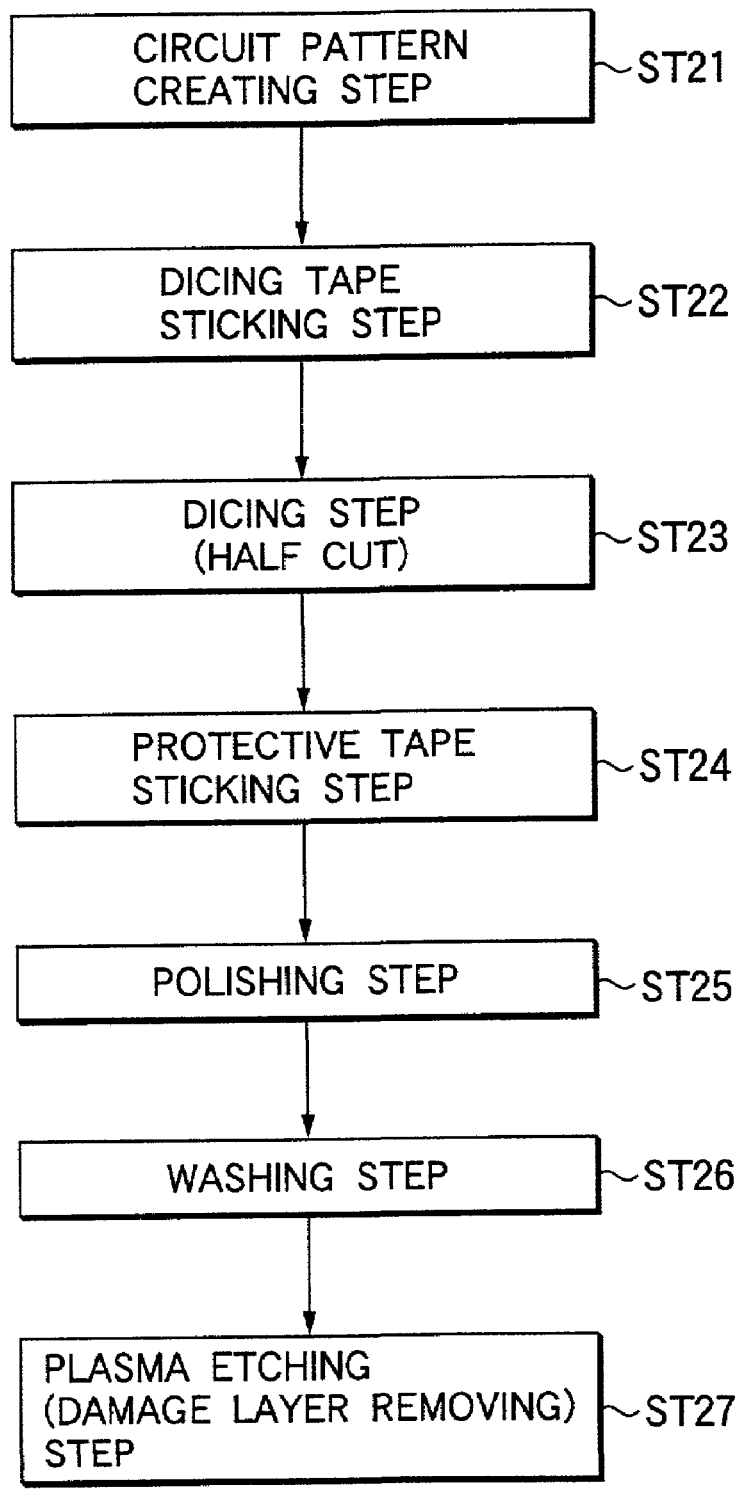
FIG. 12 is a flow chart showing a method of manufacturing a semiconductor device according to a third embodiment of the invention.

The semiconductor wafer 41 is sent to a dicing device in this state and the semiconductor wafer 41 having the dicing tape 45 stuck thereto is cut and divided into units of semiconductor elements (a dicing step) (ST17). More specifically, as shown in FIG. 11C, a cut groove 47 is formed along a cutting line by means of a cutting blade 46 so that a piece-like semiconductor device 41' stuck onto the dicing tape 45 is finished as shown in FIG. 11D.

THIRD EMBODIMENT

In the third embodiment, in a method of manufacturing a semiconductor device having a circuit pattern created on the surface of a semiconductor element in the same manner as in the second embodiment, a semiconductor wafer 41 is cut in half prior to a polishing step for thinning differently from the second embodiment.

Figure 13A:
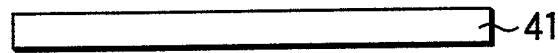
FIG. 13 is a view illustrating a process for the method of manufacturing a semiconductor device according to the third embodiment of the invention.
Figure 13B:
Figure 13C:
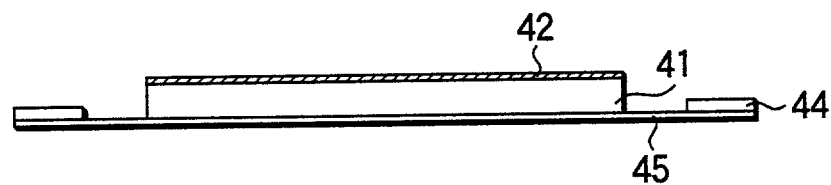

With reference to FIGS. 13A and 13B, the reference numeral 41 denotes the same semiconductor wafer as that in the second embodiment, and a circuit pattern 42 of a plurality of semiconductor elements is created on the upper surface of the semiconductor wafer 41 (a circuit pattern creating step) (ST21). As shown in FIG. 13C, next, a dicing tape 45 is stuck to the back face of the semiconductor wafer 41 having the circuit pattern 42 created thereon (a dicing tape sticking step) (ST22). More specifically, the semiconductor wafer 41 is stuck to the dicing tape 45 set to a wafer ring 44 in such an attitude that the circuit pattern 42 is turned upward.

Figure 13D:
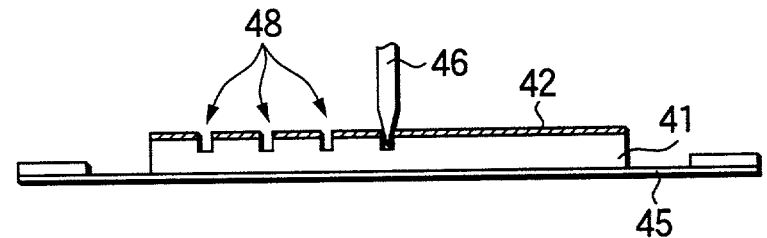
Figure 13E:
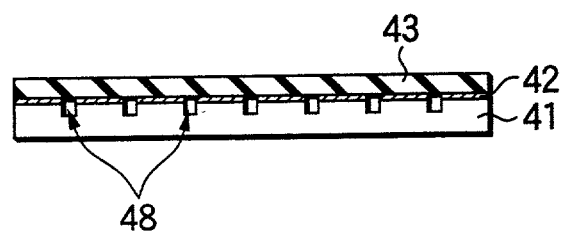

Then, the semiconductor wafer 41 is sent to a dicing device and a groove 48 for dividing the semiconductor wafer 41 into units of semiconductor elements is formed on the surface of the semiconductor wafer 41 (a circuit pattern formation surface) stuck to the dicing tape 45 as shown in FIG. 13D (a half cut step by dicing) (ST23). At this time, the depth of the groove 48 is set to be greater than the thickness of the semiconductor element obtained after a product is finished. After the half cut step, as shown in FIG. 13E, the protective tape 43 is stuck to the surface of the semiconductor wafer 41 having the groove 48 formed thereon (a protective tape sticking step) (ST24).

Then, the semiconductor wafer 41 is accommodated in a magazine 32A (32B) and is thus sent to the semiconductor wafer processing apparatus 90 shown in FIG. 6, and the magazine 32A (32B) is attached to a wafer housing portion 32. The back face of the semiconductor wafer 41 taken out of the wafer housing portion 32 by the robot arm of a wafer delivery portion 33 is mechanically polished and thinned to have such a thickness as to reach the groove 48 so that the semiconductor wafer 41 is divided into the unit of the semiconductor element (a polishing step) (ST25).

Figure 14A:
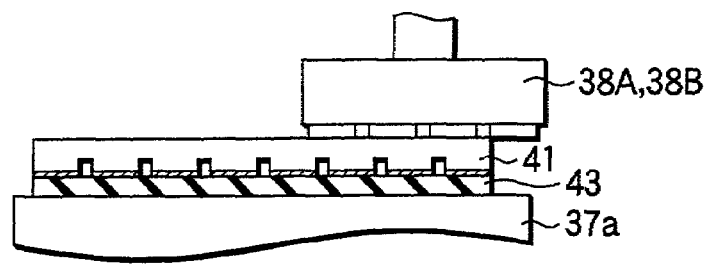
FIG. 14 is a view illustrating the process for the method of manufacturing a semiconductor device according to the third embodiment of the invention.
Figure 14B:
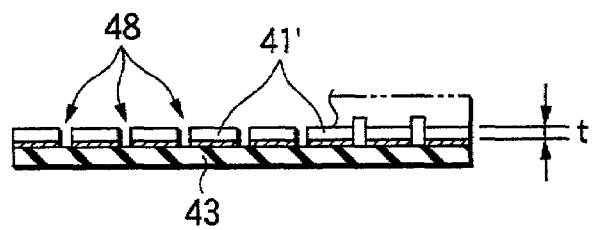

More specifically, the semiconductor wafer 41 is aligned in a pre-center portion 35 in the same manner as in the second embodiment and is then mounted on a wafer holding portion 37a of a turntable 37 by a wafer delivery-in portion 39A in such an attitude that the back face of the semiconductor wafer 41 is turned upward, and the back face is mechanically polished by the first polishing unit 38A and the second polishing unit 38B as shown in FIG. 14A. As shown in FIG. 14B, consequently, the semiconductor wafer 41 is thinned to have a predetermined thickness t and is divided into units of piece-like semiconductor devices 41' on the protective tape 43 by means of the groove 48 formed by the half cutting.

Figure 14C:
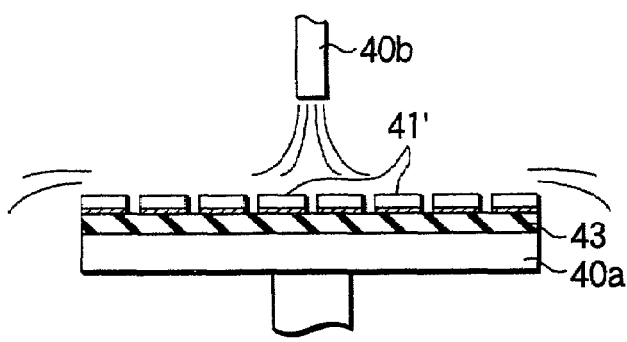

Then, the semiconductor devices 41' connected by the protective tape 43 are delivered from a polishing portion 36 to a washing portion 40 by the wafer delivery-out portion 39B. Herein, the back face of the semiconductor wafer divided by the mechanical polishing or grinding is washed with a liquid to remove polishing dust generated at the polishing step (a washing step) (ST26). More specifically, as shown in FIG. 14C, the protective tape 43 is held in a wafer holding portion 40a of the washing portion 40 and a washing solution is jetted to the back face (the mechanical polished surface) by means of a washing nozzle 40b in this state.

Next, the washed semiconductor wafer 41 is sent to one of a first plasma treating portion 34A and a second plasma treating portion 34B by the wafer delivery portion 33 to remove a damage layer in the mechanical polishing or grinding by plasma etching the back face of the semiconductor wafer 41 washed at the washing step (a damage layer removing step) (ST27). The damage layer is removed in the same manner as in the second embodiment (ST15).

As described above, in the methods of manufacturing a semiconductor device according to the second and third embodiments, it is not necessary to provide safety attendant equipment for preventing danger to a worker which is required in a conventional wet etching treatment using chemicals such as fluoronitric acid or drainage processing equipment for processing a drainage after use. Accordingly, the cost of the equipment and a running cost can be reduced greatly and an etching treatment can be efficiently carried out at a low cost. Thus, it is possible to implement a method of manufacturing a semiconductor device at a low cost.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

[Effect of the Invention]

According to the plasma treating apparatus and method in accordance with the invention, the electrode member having the three-dimensional network structure of which clearance constitutes the irregular paths for causing a gas for plasma generation to pass therethrough is used as the electrode member to be attached to the front surface of the gas supplying port of the electrode for plasma generation. Consequently, the distribution of the gas to be supplied can be made uniform to prevent an abnormal discharge and uniform etching having no variation can be carried out. Moreover, the three-dimensional network structure can produce a sufficient durability even in a place to be directly exposed to the plasma. Furthermore, since the gas mixture of a fluorine based gas and helium is used to carry out the etching, the etched surface can become a mirror-like finished surface.

According to the method of manufacturing a semiconductor device in accordance with the invention, in the manufacture of the semiconductor device having a circuit pattern created on the surface of a semiconductor element, the back face of a semiconductor wafer thinned by mechanical polishing or grinding is washed with a liquid and polishing dust generated at the polishing step is removed, and the washed back face of the semiconductor wafer washed is subjected to plasma etching so that a damage layer generated by the mechanical polishing or grinding is removed. Consequently, it is possible to reduce an environment load as compared with conventional wet etching using chemicals and to manufacture a semiconductor device at a low cost.

What is claimed is:

1. A plasma treating method in a plasma treating apparatus comprising a treatment chamber, a first electrode having a holding portion for holding a semiconductor wafer in the treatment chamber, a second electrode provided in a position opposed to the first electrode and including a gas supplying port for supplying a gas for plasma generation to the treatment chamber and an electrode member having a three-dimensional network structure made of frame portions constituted by a fine ceramic sintered substance, and a plurality of irregular paths defined by clearance of the frame portions, through which the gas for plasma generation passes, which is attached to a front surface thereof, a pressure control portion for reducing a pressure in the treatment chamber, a gas supplying portion for supplying a mixed gas containing fluorine and helium as the gas for plasma generation to the treatment chamber through the gas supplying port, and a high frequency generating portion for applying a high frequency voltage between the first electrode and the second electrode, the method comprising the steps of:

applying a high frequency voltage between the first electrode and the second electrode while blowing off the gas for plasma generation from an irregular path constituted by a clearance of the three-dimensional network structure, thereby generating a plasma, and etching a semiconductor wafer held in the first electrode by the generated plasma.

2. The plasma treating method according to claim 1, wherein the semiconductor wafer is a silicon based substrate having a damage layer formed thereon by mechanical polishing or grinding and the damage layer is removed by plasma etching.

3. The plasma treating method according to claim 1, wherein the semiconductor wafer has a circuit pattern formed on a surface side and a damage layer provided on a back side of the semiconductor wafer is removed by plasma etching.

4. A method of manufacturing a semiconductor device having a circuit pattern created on a surface of a semiconductor element, comprising:

a circuit pattern creating step of creating a circuit pattern of a plurality of semiconductor elements on a surface of a semiconductor wafer;

a protective tape sticking step of sticking a protective tape onto the surface of the semiconductor wafer having the circuit pattern created thereon;

a polishing step of mechanically polishing and thinning a back face of the semiconductor wafer;

a washing step of washing the back face of the semiconductor wafer thus polished mechanically and removing a polishing dust generated at the polishing step;

a damage layer removing step of plasma etching the back face of the semiconductor wafer washed at the washing step; thereby removing a damage layer generated in the mechanical polishing;

a dicing tape sticking step of peeling the protective tape and sticking a dicing tape onto the back face of the semiconductor wafer; and a dicing step of cutting and dividing the semiconductor wafer having the dicing tape stuck thereto into a unit of the semiconductor element, wherein the damage layer removing step uses a plasma treating apparatus comprising a first electrode holding the semiconductor wafer with a holding surface which is hermetically stuck to the protective tape and a second electrode which is parallel with the holding surface and has a three-dimensional network structure in a position opposed to the holding surface, the three-dimensional structure being made of frame portions constituted by a fine ceramic sintered substance, and plasma etching is carried out by a plasma generated at a high frequency voltage applied between the first electrode and the second electrode while supplying a gas for plasma generation to the wafer through a plurality of irregular paths defined by clearance of the frame portions.

5. The method of manufacturing a semiconductor device according to claim 4, wherein the first electrode is cooled such that the protective tape stuck hermetically to the holding surface is not thermally damaged by heat generated by the plasma.

6. The method of manufacturing a semiconductor device according to claim 4, wherein the gas for plasma generation is a mixed gas containing a fluorine gas and a carrier gas.

7. The method of manufacturing a semiconductor device according to claim 6, wherein the carrier gas is helium.

8. A method of manufacturing a semiconductor device having a circuit pattern created on a surface of a semiconductor element, comprising:

a circuit pattern creating step of creating a circuit pattern of a plurality of semiconductor elements on a surface of a semiconductor wafer;

a dicing tape sticking step of sticking a dicing tape onto a back face of the semiconductor wafer having the circuit pattern created thereon;

a step of forming a groove for dividing the semiconductor wafer into a unit of the semiconductor element on the surface of the semiconductor wafer stuck to the dicing tape;

a protective tape sticking step of sticking a protective tape to the surface of the semiconductor wafer provided with the groove;

a polishing step of mechanically polishing and thinning the back face of the semiconductor wafer to have such a thickness as to reach the groove, thereby dividing the semiconductor wafer into the unit of the semiconductor element;

a washing step of washing, with a liquid, the back face of the semiconductor wafer thus divided by the mechanical polishing and removing a polishing dust generated at the polishing step; and a damage layer removing step of plasma etching the back face of the semiconductor wafer divided after the washing step, thereby removing a damage layer generated in the mechanical polishing, wherein the damage layer removing step uses a plasma treating apparatus comprising a first electrode holding the semiconductor wafer with a holding surface which is hermetically stuck to the protective tape and a second electrode which is parallel with the holding surface and has a three-dimensional network structure in a position opposed to the holding surface, the three-dimensional structure being made of frame portions constituted by a fine ceramic sintered substance, and plasma etching is carried out by a plasma generated at a high frequency voltage applied between the first electrode and the second electrode while supplying a gas for plasma generation to the wafer through a plurality of irregular paths defined by clearance of the frame portions.

9. The method of manufacturing a semiconductor device according to claim 8, wherein the first electrode is cooled such that the protective tape stuck hermetically to the holding surface is not thermally damaged by heat generated by the plasma.

10. The method of manufacturing a semiconductor device according to claim 8, wherein the gas for plasma generation is a mixed gas containing a fluorine gas and a carrier gas.

11. The method of manufacturing a semiconductor device according to claim 10, wherein the carrier gas is helium.

* * * * *